United States Patent
Arkun et al.

(10) Patent No.: US 8,835,955 B2
(45) Date of Patent: Sep. 16, 2014

(54) $IIIO_xN_y$ ON SINGLE CRYSTAL SOI SUBSTRATE AND III N GROWTH PLATFORM

(75) Inventors: Erdem Arkun, San Carlos, CA (US); Rytis Dargis, Fremont, CA (US); Andrew Clark, Los Altos, CA (US); Michael Lebby, Apache Junction, AZ (US)

(73) Assignee: Translucent, Inc., Palo Alto, CA (US)

( * ) Notice: Subject to any disclaimer, the term of this patent is extended or adjusted under 35 U.S.C. 154(b) by 82 days.

(21) Appl. No.: 13/221,474

(22) Filed: Aug. 30, 2011

(65) Prior Publication Data

US 2012/0104443 A1    May 3, 2012

Related U.S. Application Data

(60) Provisional application No. 61/408,775, filed on Nov. 1, 2010, provisional application No. 61/446,435, filed on Feb. 24, 2011.

(51) Int. Cl.

| | |
|---|---|
| H01L 33/60 | (2010.01) |
| H01L 29/786 | (2006.01) |
| H01L 33/00 | (2010.01) |
| H01L 29/78 | (2006.01) |
| H01L 21/762 | (2006.01) |
| H01L 21/02 | (2006.01) |
| H01L 33/12 | (2010.01) |
| H01L 33/46 | (2010.01) |

(52) U.S. Cl.
CPC .... *H01L 21/76248* (2013.01); *H01L 29/78603* (2013.01); *H01L 21/02483* (2013.01); *H01L 33/007* (2013.01); *H01L 29/7842* (2013.01); *H01L 21/02488* (2013.01); *H01L 21/02381* (2013.01); *H01L 33/12* (2013.01); *H01L 21/02532* (2013.01); *H01L 33/46* (2013.01); *H01L 21/02507* (2013.01)
USPC ............... 257/98; 257/22; 257/347; 257/21; 438/151; 438/104; 438/479; 438/85

(58) Field of Classification Search
USPC .......................................................... 257/98
See application file for complete search history.

(56) References Cited

U.S. PATENT DOCUMENTS

| | | | | |
|---|---|---|---|---|
| 6,154,475 A | * | 11/2000 | Soref et al. | 372/45.011 |
| 7,355,269 B1 | * | 4/2008 | Lebby et al. | 257/644 |
| 7,432,550 B2 | * | 10/2008 | Bojarczuk et al. | 257/347 |
| 7,498,229 B1 | * | 3/2009 | Atanackovic | 438/311 |
| 7,648,864 B2 | * | 1/2010 | Bojarczuk et al. | 438/149 |
| 7,825,470 B2 | * | 11/2010 | Atanakovic | 257/347 |

(Continued)

*Primary Examiner* — Julio J Maldonado
*Assistant Examiner* — Jaehwan Oh
(74) *Attorney, Agent, or Firm* — Parsons & Goltry; Robert A. Parsons; Michael W. Goltry

(57) ABSTRACT

A silicon-on-insulator (SOI) substrate structure and method of fabrication including a single crystal silicon substrate, a layer of single crystal rare earth oxide formed on the substrate, a layer of engineered single crystal silicon formed on the layer of single crystal rare earth oxide, and a single crystal insulator layer of $IIIO_xN_y$ formed on the engineered single crystal silicon layer. In some embodiments the III material in the insulator layer includes more than on III material. In a preferred embodiment the single crystal rare earth oxide includes $Gd_2O_3$ and the single crystal insulator layer of $IIIO_xN_y$ includes one of $AlO_xN_y$ and $AlGaO_xN_y$.

18 Claims, 4 Drawing Sheets

(56) References Cited

U.S. PATENT DOCUMENTS

| | | | |
|---|---|---|---|
| 7,923,743 B2* | 4/2011 | Bojarczuk et al. | 257/98 |
| 2005/0224879 A1* | 10/2005 | Xiang | 257/347 |
| 2007/0018203 A1* | 1/2007 | Atanackovic et al. | 257/254 |
| 2007/0066020 A1* | 3/2007 | Beach | 438/285 |
| 2008/0073704 A1* | 3/2008 | Yasuda | 257/324 |
| 2008/0135924 A1* | 6/2008 | Lebby et al. | 257/327 |
| 2008/0164581 A1* | 7/2008 | Cho et al. | 257/632 |
| 2008/0179606 A1* | 7/2008 | Usuda et al. | 257/94 |
| 2008/0308831 A1* | 12/2008 | Bojarczuk et al. | 257/98 |
| 2008/0318367 A1* | 12/2008 | Shimomura et al. | 438/151 |
| 2009/0068828 A1* | 3/2009 | Chambers et al. | 438/592 |
| 2009/0085115 A1* | 4/2009 | Atanackovic | 257/347 |
| 2010/0038521 A1* | 2/2010 | Clark et al. | 250/208.6 |
| 2010/0038541 A1* | 2/2010 | Clark et al. | 250/338.1 |
| 2010/0052037 A1* | 3/2010 | Chin | 257/324 |
| 2010/0065815 A1* | 3/2010 | Bojarczuk et al. | 257/13 |
| 2011/0117708 A1* | 5/2011 | Shimomura et al. | 438/164 |

\* cited by examiner

US 8,835,955 B2

IIIO$_x$N$_y$ ON SINGLE CRYSTAL SOI SUBSTRATE AND III N GROWTH PLATFORM

CROSS-REFERENCE TO RELATED APPLICATION

This application claims the benefit of U.S. Provisional Patent Application No. 61/408,775, filed 1 Nov. 2010 and, U.S. Provisional Patent Application No. 61/446,435, filed 24 Nov. 2010.

FIELD OF THE INVENTION

This invention relates to the growth of IIIO$_x$N$_y$ on single crystal SOI substrates and to form a template for the further growth of III-N, primarily for use in the semiconductor industry.

BACKGROUND OF THE INVENTION

In the semiconductor and related industries, for example, it is common to form an insulating layer of material on a silicon substrate and then form a conductive layer (generally silicon) on the insulating layer to produce what is commonly referred to as a silicon-on-insulator (SOI) substrate for use in the further growth of semiconductor devices. To achieve a desirable SOI substrate the conductive layer should be a layer of single crystal material. Further, to achieve a layer of single crystal material on the insulating layer the insulating layer generally must be a single crystal layer. In the prior art it can be seen that the formation of a single crystal insulating layer of desirable insulating material on a silicon substrate is very difficult.

In the prior art, a layer of GaN epitaxially grown on an SOI substrate has been used as a base for the further growth of semiconductor devices. Generally, the prior art deals with ways to relieve or release strain in the GaN layer to reduce stress formation and cracking in layers grown on the GaN layer. One example of the prior art is an article entitled "Improved Quality GaN by Growth on Compliant Silico-on-Insulator Substrates Using Metalorganic Chemical Vapor Deposition", J. Cao et al., *Journal of Applied Physics*, Vol. 83, No. 7, (April 1998), 3829-3834. A second example is in an article entitled "Characterization of GaN layers Grown on Silicon-on-Insulator substrates", S. Tripathy et al., *Applied Surface Science*, 253, (2006), 236-240. In prior art methods and devices of this type the devices are limited to materials that can be lattice matched to GaN and the materials grown on the GaN will retain all of the defects and fractures present in the layer of GaN.

In a copending U.S. patent application entitled "AlO$_x$N$_y$ ON REO/Si", filed 1 Nov. 2010, bearing Ser. No. 61/408,783, and incorporated herein by reference, a layer of AlO$_x$N$_y$ is epitaxially grown substantially crystal lattice matched to a silicon substrate. In this disclosure a layer of rare earth oxide is grown directly on a silicon substrate and one or more III-rare earth oxide layers are epitaxially grown on the rare earth oxide layer to provide a gradual crystal lattice match between the rare earth oxide and a layer of AlO$_x$N$_y$. The AlO$_x$N$_y$ can then be used to grow III-N based materials for various semiconductor devices.

It would be highly advantageous, therefore, to remedy the foregoing and other deficiencies inherent in the prior art.

Accordingly, it is an object of the present invention to provide new and improved materials and methods of fabricating insulative layers on semiconductor wafers.

Accordingly, it is an object of the present invention to provide new and improved strain engineered compliant substrates.

It is another object of the present invention to provide new and improved III-N layers epitaxially grown on strain engineered compliant substrates.

SUMMARY OF THE INVENTION

Briefly, to achieve the desired objects of the instant invention in accordance with one embodiment thereof, a silicon-on-insulator (SOI) substrate structure includes a single crystal silicon substrate, a layer of single crystal rare earth oxide formed on the substrate, a layer of engineered single crystal silicon formed on the layer of single crystal rare earth oxide, and a single crystal insulator layer of IIIO$_x$N$_y$ formed on the engineered single crystal silicon layer. In a preferred embodiment the single crystal rare earth oxide includes Gd$_2$O$_3$ and the single crystal insulator layer of IIIO$_x$N$_y$ includes AlO$_x$N$_y$.

To achieve the desired objects of the instant invention in accordance with another embodiment thereof, a strain engineered complaint substrate structure includes a layer of single crystal rare earth oxide formed on a single crystal silicon substrate. A layer of strain engineered single crystal silicon is formed on the layer of single crystal rare earth oxide and a single crystal insulator layer of III$_u$III$_v$O$_x$N$_y$ is formed on the strain engineered single crystal silicon layer.

The desired objects of the instant invention are further achieved in accordance with a method of fabrication thereof including the steps of providing a single crystal silicon substrate and forming a layer of single crystal rare earth oxide on the substrate. The method also includes the steps of forming a layer of engineered single crystal silicon on the layer of single crystal rare earth oxide and forming an insulator layer of IIIO$_x$N$_y$ on the engineered single crystal silicon layer. In at least one embodiment of the method the step of forming the insulator layer of IIIO$_x$N$_y$ includes forming the III material in the insulator layer with more than one metal from the III group of the periodic table, as an example the insulator layer is designated III$_u$III$_v$O$_x$N$_y$ and preferably includes AlGaO$_x$N$_y$.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF A PREFERRED EMBODIMENT

Figure 1:
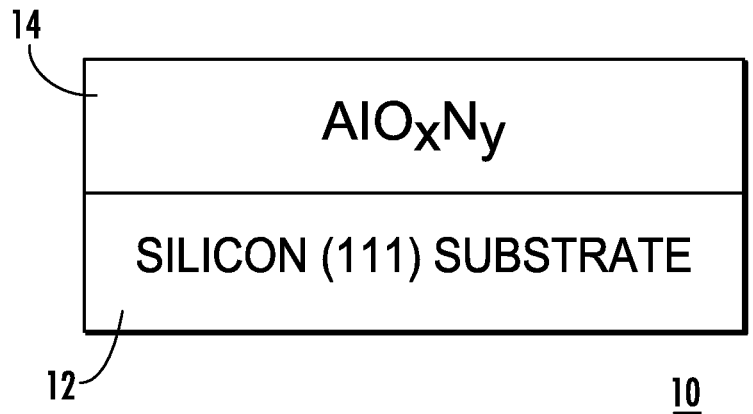
FIG. 1 is a simplified side view of a prior art structure including a silicon substrate with a preferred insulating layer formed thereon.

Turning to FIG. 1, a simplified view of a prior art structure, designated 10, is illustrated. Structure 10 includes a silicon substrate 12, which in this description is illustrated as <111> silicon. A layer 14 of preferred insulating material, such as $AlO_xN_y$, is formed directly on the surface of substrate 12. A major problem with structure 10 is that insulating layer 14 can only be formed relatively thin because of the difference in lattice structure (generally the lattice spacing) between silicon substrate 12 and insulating layer 14 of $AlO_xN_y$. Because insulating layer 14 is relatively thin, the insulating properties are not as good as desired.

Figure 2:
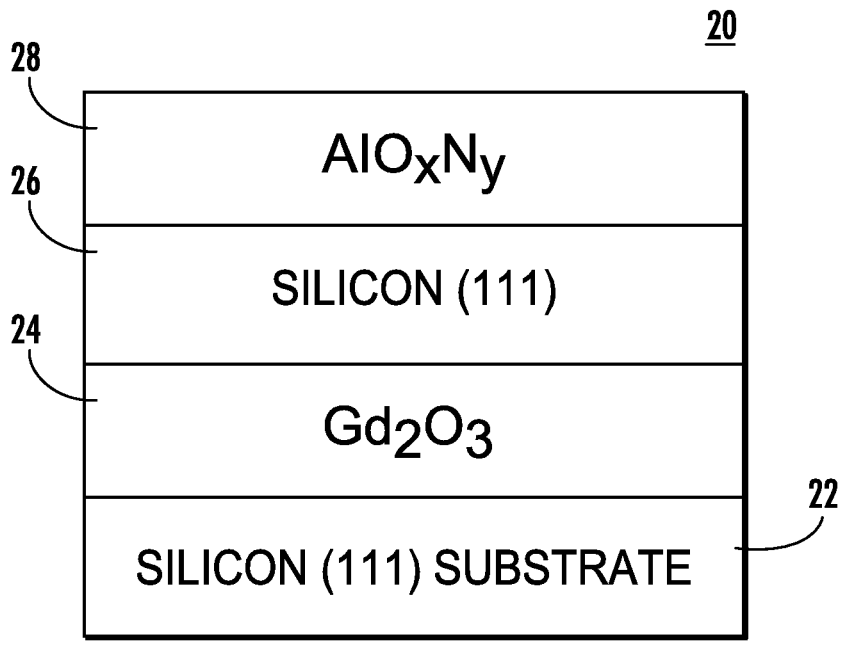
FIG. 2 is a simplified side view of an improved structure including silicon substrate with a preferred insulating layer formed thereon in accordance with the present invention.

A structure 20, illustrated in FIG. 2 overcomes much of the problems prevalent in structure 10 of FIG. 1. Structure 20 includes a single crystal silicon substrate 22 illustrated as having a <111> upper face for the growth of additional layers, i.e., the layers of structure 20 are grown on <111> silicon. It should be understood however that the present invention is not limited to <111> silicon but that <110> and <100> silicon or variations thereof could also be used. Also, while silicon substrate 22 is illustrated as single crystal pure silicon it should be understood that single crystal substrates composed of materials containing elements other than silicon or in addition to silicon may be used.

A single crystal layer 24 of rare earth oxide (REO) is grown directly on the surface of silicon substrate 22. Throughout this disclosure whenever rare earth materials are mentioned it will be understood that "rare earth" materials are generally defined as any of the lanthanides as well as scandium and yttrium. In this preferred example, the REO layer 24 is a thin layer of $Gd_2O_3$, which is substantially crystal lattice matched with silicon. In some applications it may be desirable to use a substrate composed of materials other than pure silicon and in these applications it will be understood that other rare earth materials that are substantially crystal lattice matched with the substrate material can be used if desired. Thus, REO layer 24 is relatively easily grown as a thin layer of single crystal material directly on substrate 22.

A very thin layer 26 of engineered single crystal silicon is grown on the surface of REO layer 24. In the preferred embodiment, layer 26 has a thickness in the range of 1 nm to 10 nm. Generally the crystal orientation of layer 26 will be the same as the crystal orientation of substrate 22, in this example <111>. Layers 22, 24, and 26 form a single crystal SOI substrate, i.e. a single crystal or crystalline silicon-on-insulator substrate.

A preferred insulator layer 28 of $AlO_xN_y$, is grown directly on engineered single crystal silicon layer 26. While an aluminum oxynitride is described in this example to simplify the explanation, it should be understood that insulator layer 28, generally depicted herein as $IIIO_xN_y$, could include any metal from the III group of the periodic table, such as Al, Ga, etc., or any combination thereof. Thus, layer 28 could be depicted generically as $III_uIII_vO_xN_y$ where $III_u$ is a first material selected from the III group of metals in the periodic table and $III_v$ is a second material selected from the III group. Further, in any specific embodiment either u or v could be zero. Because layer 28 of preferred insulating material, such as $AlO_xN_y$, is formed directly on the surface of engineered single crystal silicon layer 26 and there is a crystal mismatch, the thickness of layer 28 is similar to the thickness of layer 14 in FIG. 1. However, the insulating characteristics of combined layers 28 and 24 produce an improved or better insulating quality.

The various layers of structure 20 can be grown by a variety of methods including MBE, MOCVD, PLD (pulsed laser deposition) sputtering, ALD (atomic laser deposition), or any other known growth method for thin films.

Thus, structure 20 is relatively easily grown with single crystal material and further growth of single crystal material on the single crystal SOI structure is easily accomplished. Most of the insulation problems are overcome by the novel incorporation of the very thin engineered single crystal silicon layer. While the characteristics of the preferred insulating material layer are only slightly improved, the overall insulating quality of the structure is much better.

Figure 3:
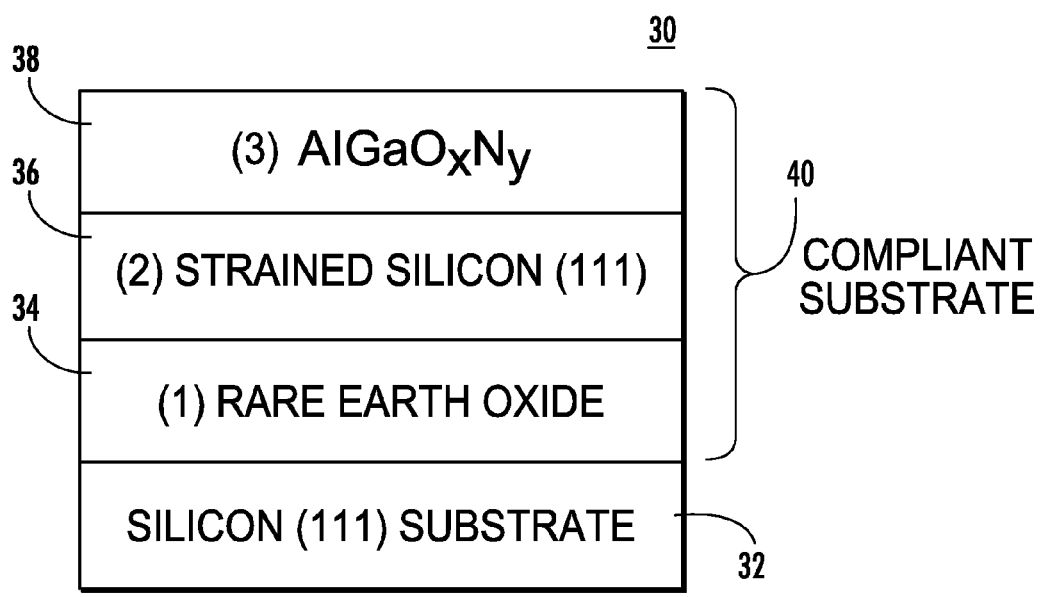
FIG. 3 is a simplified layer diagram illustrating an example of a compliant substrate in accordance with the present invention.

Turning now to FIG. 3 a simplified layer diagram of a structure, designated 30, formed in accordance with the present invention is illustrated. Structure 30 includes a single crystal silicon substrate 32 illustrated as having a <111> upper face for the growth of additional layers, i.e., the layers of structure 30 are grown on <111> silicon. It should be understood however that the present invention is not limited to <111> silicon but that <110> and <100> silicon or variations thereof could also be used. All substrate orientation can be either on or off axis. Also, while silicon substrate 32 is illustrated as single crystal pure silicon it should be understood that single crystal substrates composed of materials containing elements other than silicon or in addition to silicon may be used.

A single crystal layer 34 of rare earth oxide (REO) is grown directly on the surface of silicon substrate 32. A strained layer of silicon, generally with the same crystal orientation as substrate 32, is grown directly on REO layer 34. A layer 38 of $III_uIII_vO_xN_y$, is grown on strained silicon layer 34, where $III_u$ is a first material selected from the III group of metals in the periodic table and $III_v$ is a second material selected from the III group. In the preferred embodiment and as a specific example layer 38 includes $Al_uGa_vO_xN_y$. Layers 34, 36, and 38 form a template or compliant substrate, generally designated 40, for the further growth of III-N materials (not shown). The III-N layer is then used as a substrate for the fabrication or growth of various semiconductor devices, such as photoluminescence devices and the like.

Throughout this disclosure whenever rare earth or REO materials are mentioned it will be understood that "rare earth" materials are generally defined as any of the lanthanides as well as scandium and yttrium. The strained silicon of layer 36 can be either compressive or tensile depending on the selection or engineering of the REO composition in layer 34. That is REO layer 34 is selected or engineered such that it constrains the overgrown silicon layer 36 to a predetermined strain state, either compressive or tensile. With regard to this engineering of REO layer 34, the layer is termed or defined as Non Lattice Matched REO or NLM-REO. It should be understood that REO layer 34 can be engineered in a variety of ways and may, for example, include a mixture of various materials, a plurality of sub-layers each of different materials, etc.

Figure 4:
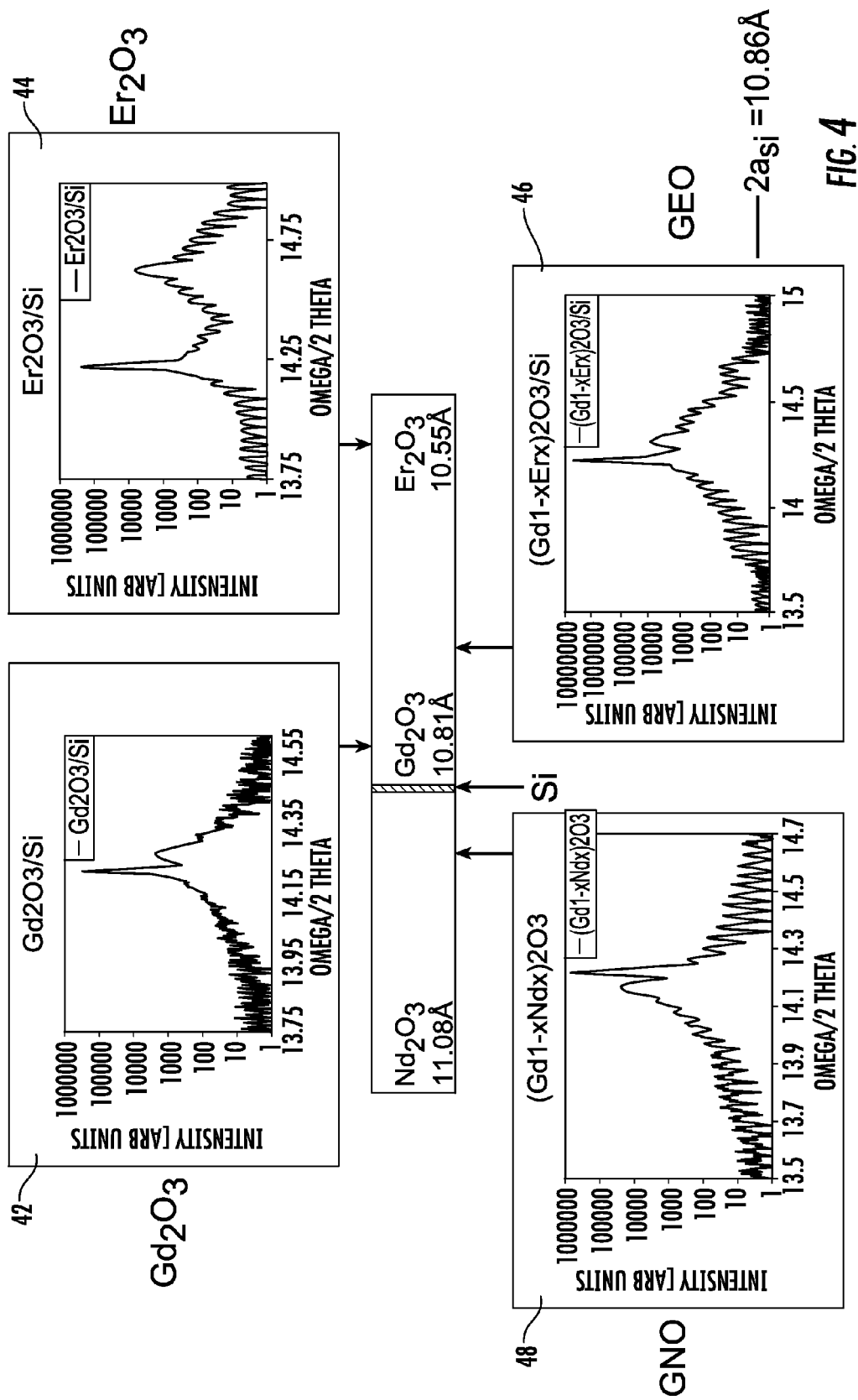
FIG. 4 illustrates some examples of strain engineering for the compliant substrate of FIG. 3.

Referring additionally to FIG. 4, some examples of strain engineered materials for use in the formation of NLM-REO layer 34 are illustrated. Four different materials are illustrated with graphs of the strain produced in each case. The first material, $Gd_2O_3$, with a strain graph designated 42, has a lattice spacing of 10.81 Å compared to $2a_{Si}$, that is approximately two times the lattice spacing of silicon, with a lattice spacing of 10.86 Å. The second material, $Er_2O_3$, with a strain graph designated 44, has a lattice spacing of 10.55 Å compared to $2a_{Si}$ with a lattice spacing of 10.86 Å. The third material, $(Gd_{1-x}Er_x)_2O_3$, with a strain graph designated 46, has a lattice spacing between 10.55 Å and 10.81 Å, depending upon the ratio of Gd and Er in the material. The fourth material, $(Gd_{1-x}Nd_x)_2O_3$, with a strain graph designated 48, has a lattice spacing between 11.08 Å (the lattice spacing of Nd) and 10.81 Å, depending upon the ratio of Gd and Nd in the material. Further, it should be understood that the stress curves of the several different rare earth oxides depict tensile stress for rare earth oxides with a lattice spacing greater than $2a_{Si}$ and compressive stress for rare earth oxides with a lattice spacing less than $2a_{Si}$. It will be understood that any of the four materials individually or in any combination, as well as any other rare earth materials or combinations thereof can be used to form NLM-REO layer 34 and to produce the desired amount of strain in silicon layer 36. Further, it will be understood that in the engineering of layer 38 at least one of the 'u' and 'v' of $III_u III_v O_x N_y$ can be varied from 0 to 1 to achieve a desired amount of stress either tensile or compressive.

Silicon layer 36 is grown directly on NLM-REO layer 34 and maintains the intended or engineered non relaxed strain state. $III_u III_v O_x N_y$ (e.g. $Al_u Ga_v O_x N_y$) layer 38 is grown directly on strained silicon layer 36 to form a template for further III-N growth. The strained silicon acts as a strain balancing layer for the III-N growth on top of $III_u III_v O_x N_y$ layer 38. The combination forms compliant substrate 40 whereby strain in the final III-N layer will be compensated by strained silicon layer 36 on REO layer 34. Strained silicon layer 36 can also be reacted with nitrogen to create a defective top layer to "float" $III_u III_v O_x N_y$ layer 38. Additional strain can be engineered by including processing steps that allow N from $III_u III_v O_x N_y$ layer 38 to react with silicon layer 36 thereby resulting in some % of silicon layer 36 (0 to 100) converting from Si to $SiN_x$. The strain engineering of compliant substrate 40 is utilized to prevent stress formation and cracking in any subsequent III-N layer or layers.

Figure 5:
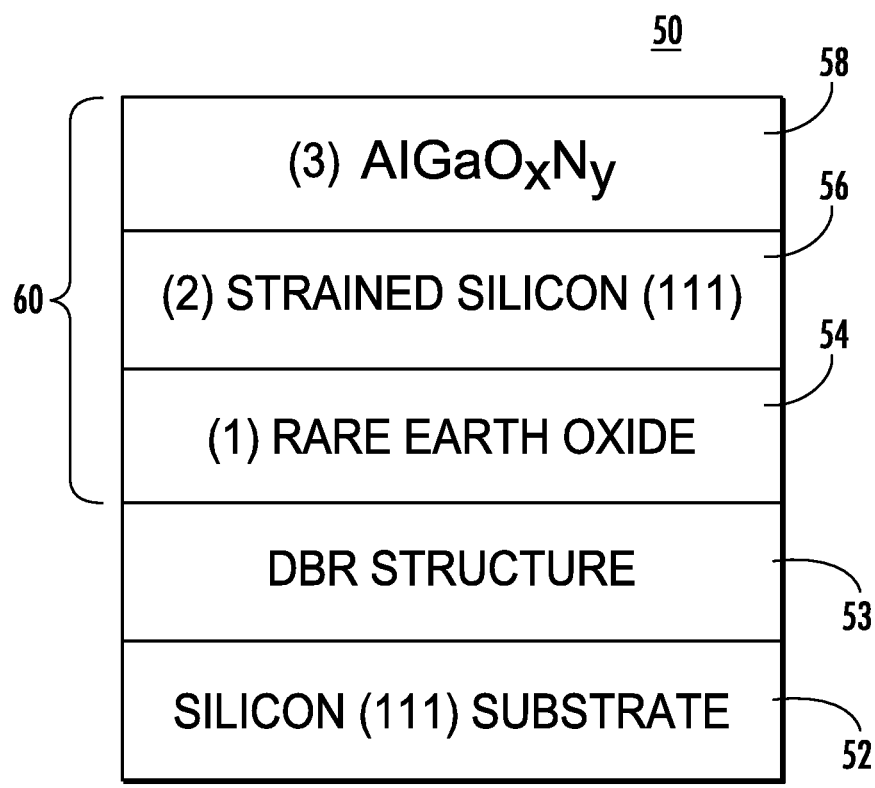
FIG. 5 is a simplified layer diagram illustrating another example of a compliant substrate in accordance with the present invention.

In some applications a III-N light emitting diode (LED), or similar device, is grown on top of complaint substrate 40. However, some of the light emitted by such an LED is directed downwardly into the silicon substrate where it is absorbed and, thus, lost. In such applications a modified structure 50, illustrated in FIG. 5, can be employed to improve the collection efficiency and the brightness of the LED. Structure 50 includes a single crystal silicon substrate 52 illustrated as having a <111> upper face for the growth of additional layers, i.e., the layers of structure 50 are grown on <111> silicon. It should be understood however that the present invention is not limited to <111> silicon but that <110> and <100> silicon or variations thereof could also be used and additionally any of the orientations included here can be on or off axis. Also, while silicon substrate 52 is illustrated as single crystal pure silicon it should be understood that single crystal substrates composed of materials containing elements other than silicon or in addition to silicon may be used.

A distributed Bragg reflector (DBR) 53 is epitaxially grown on substrate 52. In a preferred embodiment, DBR 53 is made from alternating layers of Si and REO. As understood in the art, DBR 53 includes a plurality of pairs of layers of material with different indices of refraction, so that each pair forms a partial mirror. In this application the pairs of layers are arranged to form an upwardly reflecting mirror. Generally, the number of pairs of layers and/or the different indices of refraction in the pairs determines the total percentage of downwardly directed light that is reflected back toward the upper surface.

A layer 54 of single crystal rare earth oxide (REO) is grown directly on the surface of DBR 53. A strained layer 56 of silicon, generally with the same crystal orientation as substrate 52, is grown directly on REO layer 54. A layer 58 of $III_u III_v O_x N_y$ (similar to layer 38 described above) is grown on strained silicon layer 56. Layers 54, 56, and 58 form a template or compliant substrate, generally designated 60, for the further growth of III-N materials (not shown). The III-N layer is then used as a substrate for the growth of an LED or similar device. DBR 53 forms a reflecting interface for light generated in the LED and reflects downwardly directed light back into and/or through the LED. Also, one or all of the rare earth oxide layers in DBR 53 can act as strain compensation layers and provide some stress relief or add to the desired stress condition of strained silicon layer 56. In fact, in some specific applications it is possible that layers 54 and 56 are incorporated as upper layers in DBR 53. As explained above, DBR 53 improves the collection efficiency and the brightness of the LED by reflecting light back into and through the LED and not allowing the light to be absorbed in silicon substrate 52.

Thus, new and improved strain engineered compliant substrates are disclosed. The complaint substrates include a strain engineered silicon layer utilized to prevent stress formation and cracking in the III-N layer. The strained silicon layer can be either compressive or tensile. In a preferred embodiment the strain engineering is provided by a selection of rare earth materials in a rare earth oxide interface layer between the silicon substrate and the strained silicon layer. The potential variations in stress from compressive to tensile provide a greater choice of III materials (e.g. $Al_u Ga_v O_x N_y$) in the upper layer of the compliant substrate and, thus, a greater choice of materials in the III-N layer.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A silicon-on-insulator (SOI) substrate structure comprising:
    a single crystal silicon substrate;
    a Non Lattice Matched layer of engineered single crystal rare earth oxide formed on the substrate;
    a layer of strained single crystal silicon formed on the Non Lattice Matched layer of single crystal rare earth oxide, the Non Lattice Matched layer of engineered single crystal rare earth oxide being engineered to constrain the strained single crystal silicon layer to a predetermined strain state including one of compressive or tensile; and
    a single crystal insulator layer of $IIIO_x N_y$ formed on the strained single crystal silicon layer.

2. A silicon-on-insulator (SOI) substrate structure as claimed in claim 1 wherein the silicon substrate has a crystal orientation including one of <111> silicon, <110> silicon, and <100> silicon.

3. A silicon-on-insulator (SOI) substrate structure as claimed in claim 2 wherein the layer of strained single crystal silicon has a thickness in a range of 1 nm to 10 nm.

4. A silicon-on-insulator (SOI) substrate structure as claimed in claim 2 wherein the layer of strained single crystal silicon has a crystal orientation that includes one of <111> silicon, <110> silicon, and <100> silicon comparable to the silicon substrate.

5. A silicon-on-insulator (SOI) substrate structure as claimed in claim 1 wherein the Non Lattice Matched layer of engineered single crystal rare earth oxide includes at least one rare earth material selected from the group including lanthanides, scandium and yttrium.

6. A silicon-on-insulator (SOI) substrate structure as claimed in claim 1 wherein the Non Lattice Matched layer of engineered single crystal rare earth oxide includes $Gd_2O_3$.

7. A silicon-on-insulator (SOI) substrate structure as claimed in claim 1 wherein the insulator layer of $IIIO_xN_y$ includes $AlO_xN_y$.

8. A silicon-on-insulator (SOI) substrate structure as claimed in claim 1 wherein the III material in the insulator layer of $IIIO_xN_y$ includes more than one metal from the III group of the periodic table.

9. A silicon-on-insulator (SOI) substrate structure as claimed in claim 1 wherein the III material in the insulator layer of $IIIO_xN_y$ includes $III_uIII_vO_xN_y$, and at least one of the 'u' and 'v' is variable from 0 to 1.

10. A silicon-on-insulator (SOI) substrate structure as claimed in claim 9 wherein the insulator layer of $IIIO_xN_y$ includes $AlGaO_xN_y$.

11. A strain engineered complaint substrate structure comprising:
a single crystal silicon substrate;
a Non Lattice Matched layer of engineered single crystal rare earth oxide formed on the substrate;
a layer of strain engineered single crystal silicon formed on the Non Lattice Matched layer of engineered single crystal rare earth oxide, the Non Lattice Matched layer of engineered single crystal rare earth oxide being engineered to constrain the strained single crystal silicon layer to a predetermined strain state, one of compressive or tensile; and
a single crystal insulator layer of $III_uIII_vO_xN_y$ formed on the strain engineered single crystal silicon layer.

12. A silicon-on-insulator (SOI) substrate structure as claimed in claim 11 wherein the silicon substrate has a crystal orientation including one of <111> silicon, <110> silicon, and <100> silicon and the layer of strain engineered single crystal silicon has a crystal orientation that includes one of <111> silicon, <110> silicon, and <100> silicon comparable to the silicon substrate.

13. A silicon-on-insulator (SOI) substrate structure as claimed in claim 11 wherein the insulator layer of $III_uII_vO_xN_y$ includes $AlGaO_xN_y$.

14. A photoluminescence device substrate structure comprising:
a single crystal silicon substrate;
a distributed Bragg reflector formed on the substrate;
a Non Lattice Matched layer of engineered single crystal rare earth oxide formed on the distributed Bragg reflector;
a layer of strained single crystal silicon formed on the Non Lattice Matched layer of single crystal rare earth oxide, the Non Lattice Matched layer of engineered single crystal rare earth oxide being engineered to constrain the strained single crystal silicon layer to a predetermined strain state including one of compressive or tensile; and
a single crystal insulator layer of $IIIO_xN_y$ formed on the strained single crystal silicon layer.

15. A photoluminescence devices substrate structure as claimed in claim 14 wherein the distributed Bragg reflector includes alternating layers of single crystal rare earth oxide and single crystal silicon.

16. A photoluminescence devices substrate structure as claimed in claim 15 wherein at least one of the layers of single crystal rare earth oxide are strain compensation layers.

17. A photoluminescence devices substrate structure as claimed in claim 15 wherein the Non Lattice Matched layer of engineered single crystal rare earth oxide formed on the distributed Bragg reflector and the layer of strained single crystal silicon are formed as parts of the distributed Bragg reflector.

18. A silicon-on-insulator (SOI) substrate structure as claimed in claim 1 wherein the Non Lattice Matched layer of engineered single crystal rare earth oxide includes one of a mixture of various rare earth oxides or a plurality of sub-layers each sub-layer including different rare earth oxides.

* * * * *